(12) United States Patent
Yamaji et al.

(10) Patent No.: US 6,381,449 B1
(45) Date of Patent: Apr. 30, 2002

(54) FREQUENCY CONVERTER

(75) Inventors: Takafumi Yamaji, Kanagawa-ken; Tetsuro Itakura, Tokyo; Hiroshi Tanimoto, Kanagawa-ken, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/337,525

(22) Filed: Jun. 22, 1999

(30) Foreign Application Priority Data

Jun. 30, 1998 (JP) ............................................. 10-199539

(51) Int. Cl.[7] ............................... H04B 1/26; H04B 15/00
(52) U.S. Cl. ........................ 455/313; 455/317; 455/323; 455/324; 455/326; 455/311; 327/113
(58) Field of Search ................................... 455/313, 311, 455/317, 323, 324, 326, 173; 327/113; 307/520; 179/170

(56) References Cited

U.S. PATENT DOCUMENTS

| 4,238,648 A | * | 12/1980 | Epworth | ..................... 179/170 |
|---|---|---|---|---|
| 4,855,627 A | * | 8/1989 | Hitomi | ..................... 307/520 |
| 5,630,228 A | * | 5/1997 | Mittel | ..................... 455/326 |
| 6,043,810 A | * | 3/2000 | Kim et al. | ..................... 345/173 |

FOREIGN PATENT DOCUMENTS

JP    4-267610    9/1992

OTHER PUBLICATIONS

Jan Crols, et al. "A 1.5 GHz Highly Linear CMOS Down-conversion Mixer", IEEE Journal of Solid–State Circuits, vol. 30, No. 7, Jul. 1995, pp. 736–742.

* cited by examiner

Primary Examiner—Lee Nguyen
Assistant Examiner—Danh Le
(74) Attorney, Agent, or Firm—Oblon, Spivak, McClelland, Maier & Neustadt, P.C.

(57) ABSTRACT

A frequency converter including a mixer circuit which inputs a local oscillation signal and a radio-frequency input signal modulated for communication of information, and performs frequency conversion. A buffer amplifier is higher than a desired signal frequency band, and has a low-pass passage characteristic of cut-off frequency lower than an adjacent channel carrier frequency.

6 Claims, 10 Drawing Sheets

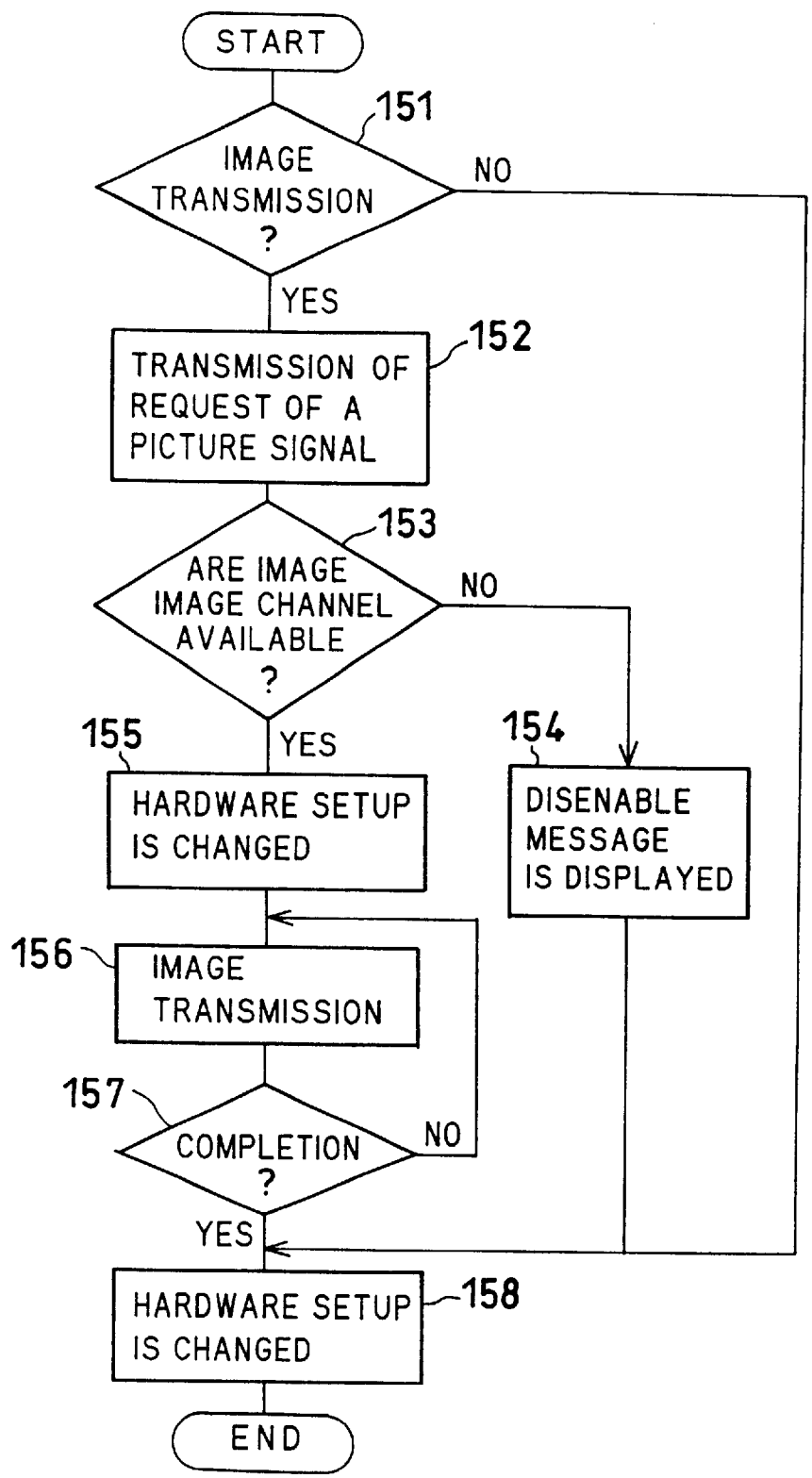

FREQUENCY CONVERTER

BACKGROUND OF THE INVENTION (1) Field Of The Invention

This invention relates to the suitable frequency converter for the receiver of a direct conversion system (Zero and IF system) or a LOW-IF system especially with respect to the frequency converter used for the receiver of cable communication or radio communication.

(2) Description Of The Related Art

The circuit shown in FIG. 16 is known as a frequency converter of the receiver of the conventional direct conversion system or a LOW-IF system. In this frequency converter, the modulated radio-frequency signal is inputted from the terminal RF of a mixer circuit 1, and is outputted as signal current from the collector terminal of a transistor Tr1. On the one hand, a local oscillation signal is inputted into a terminal LO, and it changes transistors Tr2 and Tr3 by turns into a conducting state and a cutting state.

For this reason, local oscillation frequency can distribute by turns the signal outputted from the collector of a transistor Tr1 to the collector of transistors Tr2 and Tr3, and the multiplication of a radio-frequency signal and a local oscillation signal is performed.

Consequently, frequency-converted output current is outputted from the collector of transistors Tr2 and Tr3, and is transformed into voltage in the load circuit 3. This voltage is amplified in a buffer amplifier 2, and is outputted as output voltage having small output impedance. In a radio receiver, the output signal of a frequency converter is inputted into a channel-select filter.

In many cases, since it is premised on an input signal being inputted from the source of a voltage signal, the active filter made as an integrated circuit needs the buffer amplifier (output buffer) for the output terminal of a frequency converter. Therefore, a frequency converter consists of a mixer circuit and a buffer amplifier, and a channel-select filter is connected to this buffer-amplifier output terminal.

The problem of the output buffer of a frequency converter is described by B. Razavi's et al. "Design Consideration for Direct Conversion Receivers" (IEEE Transaction on Circuit and Systems-II:Analog and Digital Signal Processing, Vol. 44, No. 6, June 1997). Moreover, when the output of an output buffer is inputted into a channel-select filter, there are some conditions with which the buffer amplifier of a frequency converter should fill a filter to make it function as a design.

The following four points are mentioned as a difficult thing among those conditions or trade-offs in the conventional circuit.

Namely, 1) The desired signal in the output terminal of a mixer circuit is small value. On the one hand, the signal of an adjacent channel is sometimes large by 60 dB, for example, compared with a desired signal. This is 1000 times on voltage. In order to make noise of an output buffer smaller than a desired signal and not to make a desired signal frequency band generate intermodulations in an output buffer, linear amplification of the desired signal needs to be carried out, even if there is an input of a large adjacent signal.

2) The cut-off frequency of a buffer amplifier needs to be high enough compared with the cut-off frequency of a channel-select filter so that the cut-off frequency of a buffer amplifier may not affect the cut-off frequency of a channel-select filter. Moreover, it is required to amplify linearly at least to the signal of the cut-off frequency of an output buffer, and current consumption of a buffer amplifier needs to be increased.

3) The gain of a mixer circuit is proportional to the parallel impedance of a load circuit and the input impedance of an output buffer. Therefore, in order to make a gain as high as possible, the large input impedance of an output buffer is necessary.

4) The output impedance of an output buffer needs to be small enough compared with the input impedance of a channel-select filter in order not to affect the gain change of the passband of a channel-select filter.

In order not to affect a channel-select filter as above-mentioned, as for the output buffer of the conventional frequency converter, it was requested the broadband characteristic. For this reason, since the signal of an adjacent channel was amplified like the desired signal, it was requested to amplify linearly the signal of a level far larger than a desired signal, too.

On the one hand, a channel-select filter is realizable as an integrated circuit in a direct conversion system or a LOW-IF system. The active filter using the operation amplification circuit etc. is used for the channel-select filter in an integrated circuit.

The examples of these active filters are disclosed in "1.9 GHz Si Direct Conversion Receiver IC for QPSK Modulation Systems" (IEICE Transaction elctronics, Vol.E79-C, No. 5 May 1996) by Takahashi etc. and "A CMOS Channel-Select Filter for a Direct Conversion Wireless Receiver" (IEEE Journal of Solid-State Circuits, Vol. 32, No. 5, pp. 722–729, May 1997) by P. J. Chang, A. Rofougaran, and Asad A. Abidi.

The filter which consists of two or more blocks is used for these channel-select filters, and each block cannot remove unnecessary signals of adjacent channels, but the desired characteristic is realized on the whole. Moreover, these blocks also have the function which amplifies a desired signal. That is, amplification of a desired signal and removal of unnecessary signals are performed step by step.

For example, if you amplify 10 times, without removing an adjacent signal when an adjacent signal 1000 times the size of a desired signal is inputted, suppose that an adjacent signal will exceed power-supply voltage. Also in this case, you can get the signal less exceeding power-supply voltage by amplifying a desired signal 10 times and amplifying adjacent signals 0.1 times by changing the characteristic of a filter.

Although the method of amplifying a desired signal is also after removing an unnecessary signal, since the active filter excellent in the frequency selection characteristic does not have the good noise characteristic, a signal-to-noise ratio (SNR) deteriorates by this method.

The step which repeats removing a small quantity of unnecessary signals using the filter of the gently-sloping frequency characteristic, and amplifying a small quantity of desired signals is taken for this reason, often.

The frequency characteristic and the gain of each block are determined from the balance with noise so that the signal which passed two or more blocks may have desired amplitude and the desired frequency characteristic.

Thus, it was asked for the output buffer of a frequency converter having a large signal passband compared with a channel-select filter in order not to affect the characteristic of the designed filter. Therefore, the signal of an unnecessary adjacent channel was also amplified and outputted.

SUMMARY OF THE INVENTION

The purpose of this invention is to offer the frequency converter which can obtain the desired receiving characteristic with few current consumption.

Other purpose of this invention is to offer the frequency converter which gives a part of function of a channel-select filter to an output buffer, in order to cancel the above-mentioned conditions 1 and 2.

In order to ease or solve the above-mentioned conditions 3 and 4, other purpose of this invention is to offer the frequency converter which has an output buffer with large input impedance and small output impedance.

According to the fundamental feature of this invention, a frequency converter equipped with the mixer circuit which inputs the radio-frequency input signal and the local oscillation signal which were modulated for communication of information, and changes frequency, and the buffer amplifier which is higher than a desired signal frequency band, and has the low-pass passage characteristic of cut-off frequency lower than adjacent channel carrier frequency is offered.

The frequency converter of this invention is equipped with the buffer amplifier which has the frequency characteristic of the input part of a channel-select filter, and the function as a buffer. Since a desired signal needs to be amplified, the cut-off frequency of this output buffer needs to be higher than a desired signal frequency band. Moreover, in order to remove and amplify the signal of an adjacent channel in the case of the communication system which uses an adjacent channel, or a LOW-IF system, the cut-off frequency needs to be made smaller than the carrier frequency of an adjacent channel.

In the case of the system using the channel in every other one, like PHS (Personal Handy-phone System), unnecessary signals need to be removed by making cut-off frequency smaller than the carrier frequency of the following adjacent channel in which unnecessary signals actually exist.

Because amplifying an unnecessary signal by using the output buffer of a narrow zone is lost, the linear amplification range of an output buffer can be chosen small. By making the linear amplification range small, current consumption can be made few. Naturally, there are many mixer circuits of current output type like the Gilbert multiplication circuit. A current-voltage converter can be used as a buffer amplifier connected to the output terminal of these mixer circuit of current output type. The input impedance of a current-voltage converter is small, and voltage change of the output terminal of a mixer circuit becomes small.

For this reason, there is also an advantage which can avoid the distortion by output voltage change. Because the conventional channel-select filter was designed on the assumption that a voltage input, the conventional frequency converter needed to use the current-voltage converter as a buffer amplifier. And in order not to affect the characteristic of a channel-select filter, the frequency characteristic of this buffer amplifier needed to be the broadband. The current-voltage converter of the frequency converter by this invention has the frequency characteristic of the low-pass passage type cut-off frequency of which being higher than desired signal frequency band and being lower than adjacent channel carrier frequency. For this reason, the large signal of an adjacent channel does not need to be amplified linearly and current consumption can be made small.

Furthermore, this invention offers the frequency converter having the mixer circuit which inputs the radio-frequency input signal modulated for communication of information, and a local oscillation signal, and converts frequency, and the output buffer amplifier comprised from the adjoint circuit of a Sallen-Key circuit, and a current-voltage converter, and characterized by using variable capacity elements as capacity elements in the adjoint circuit. In this invention, an occupancy frequency band can be changed if needed.

Furthermore, this invention offers the frequency converter having the mixer circuit which inputs the radio-frequency input signal modulated for communication of information, and a local oscillation signal, and converts frequency, and the output buffer amplifier comprised from the adjoint circuit of a Sallen-Key circuit, and a current-voltage converter, and characterized by using variable resistance elements as resistance elements in the current-voltage converter. According to this invention, a conversion gain is changeable.

Furthermore, this invention provides the frequency converter having the mixer circuit which inputs the radio-frequency input signal modulated for communication of information, and a local oscillation signal, and converts frequency, and the output buffer amplifier comprised from the adjoint circuit of a Sallen-Key circuit, and a current-voltage converter, and characterized by using variable resistance elements as resistance elements in the adjoint circuit and the current-voltage converter.

Moreover, this invention provides the frequency converter in which, two or more steps of buffer amplifiers are connected to the mixer circuit in the above-mentioned constitution.

BRIEF DESCRIPTION OF THE DRAWINGS

FIG. 15 is a diagram showing the flow chart in the case of transmitting a picture signal in relation to the 6th embodiment of the invention.

DESCRIPTION OF THE PREFERRED EMBODIMENT

Figure 1:
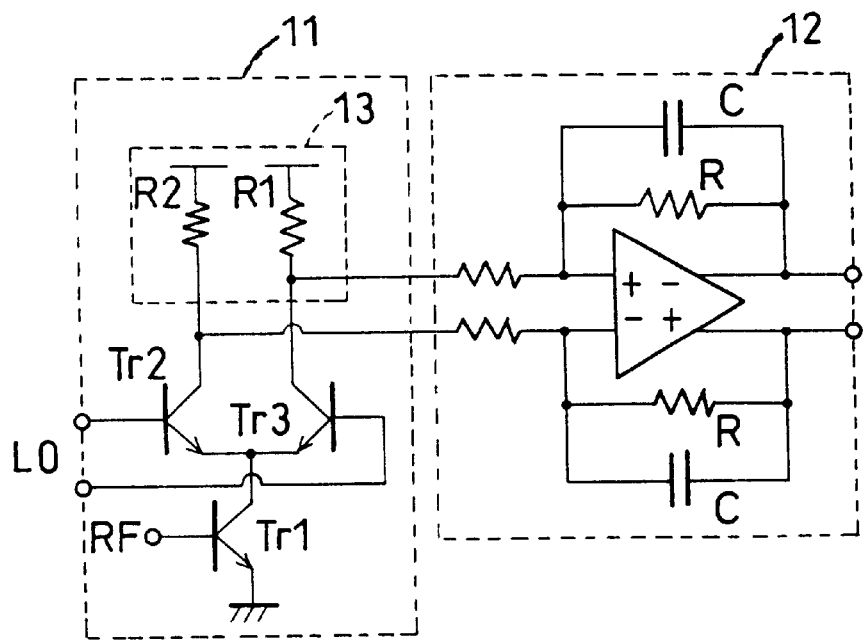
FIG. 1 is a circuit diagram of the frequency converter of the 1st embodiment of the invention.

FIG. 1 shows the circuit constitution of the frequency converter in connection with the 1st embodiment of this invention.

This frequency converter is comprised of a mixer circuit 11 and the buffer amplifier 12. The load circuit 13 containing resistance R1 and R2 and the transistors Tr1, Tr2, and Tr3 comprise a mixer circuit 11. A local oscillation signal is inputted into terminal LO of a mixer circuit 11, and a radio-frequency signal is inputted into terminal RF.

In order to obtain the low-pass passage characteristic, the feedback circuit of buffer amplifier 12 is comprised of the parallel circuit of capacity element C and resistance element R. Since a desired signal needs to be amplified, the cut-off frequency of buffer amplifier 12 needs to be higher than the desired signal frequency band fB.

On the one hand, in the communication system which uses an adjacent channel, or a LOW-IF system, in order to amplify signals after removing the signal of an adjacent channel, cut-off frequency of buffer amplifier 12 needs to be made smaller than the carrier frequency fC of an adjacent channel.

In the case of the system using the channel in every other one without an adjacent channel, like PHS, an unnecessary signal needs to be removed by making cut-off frequency of buffer amplifier 12 smaller than the carrier frequency of the following adjacent channel in which an unnecessary signal actually exists. Therefore, conditions about time constant RC of feedback circuit of buffer amplifier 12 are set as $2\pi fB < RC < 2\pi fC$.

Thus, since amplifying unnecessary signal will be lost if band is restricted, the linear amplification range of buffer amplifier 12 can be chosen small. By making the linear amplification range small, current consumption can be made few.

Next, the operation of frequency converter of FIG. 1 is explained. If local oscillation signal and radio-frequency signal are inputted into terminal LO and terminal RF, respectively, radio-frequency signal outputted from collector of transistor Tr1 can distribute to collector of local oscillation signal τ transistors Tr2 and Tr3 inputted from terminal LO alternately, and will be outputted to buffer amplifier 12. That is, signal multiplied the local oscillation signal by the radio-frequency signal is outputted to buffer amplifier 12.

Time constant RC of feedback circuit of buffer amplifier 12 is set up so that it may become $2\pi fB < RC < 2\pi fC$. Therefore, unnecessary signals other than desired signal of the inputted signals equivalent to two or more channels (namely, unnecessary signals of channel adjacent to desired channel) do not pass through CR circuit, and only desired signal pass through CR circuit and is amplfied and is outputted.

Figure 2:
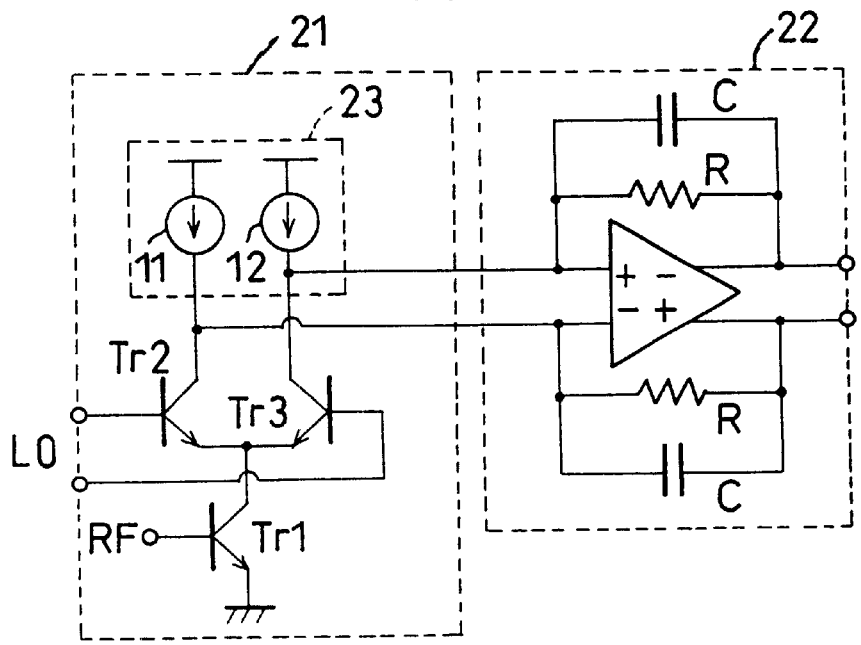
FIG. 2 is a circuit diagram of the frequency converter of the 2nd embodiment of the invention.

FIG. 2 shows circuit constitution of frequency converter in connection with the 2nd embodiment of the invention. In this circuit, since mixer circuit 21 is current output type, current-source circuits 11 and 12, such as active load, are used as load circuit 23. Buffer amplifier 22 is a current input voltage output circuit, and has low-pass passage characteristic. Cut-off frequency of buffer amplifier 22 is higher than desired signal band fB, and lower than carrier frequency of adjacent channel fC. Since the voltage change in input terminal of buffer amplifier 22 is very small, this frequency converter has advantage of not generating intermodulation by the nonlinearity of collector parasitic capacity.

Figure 3:
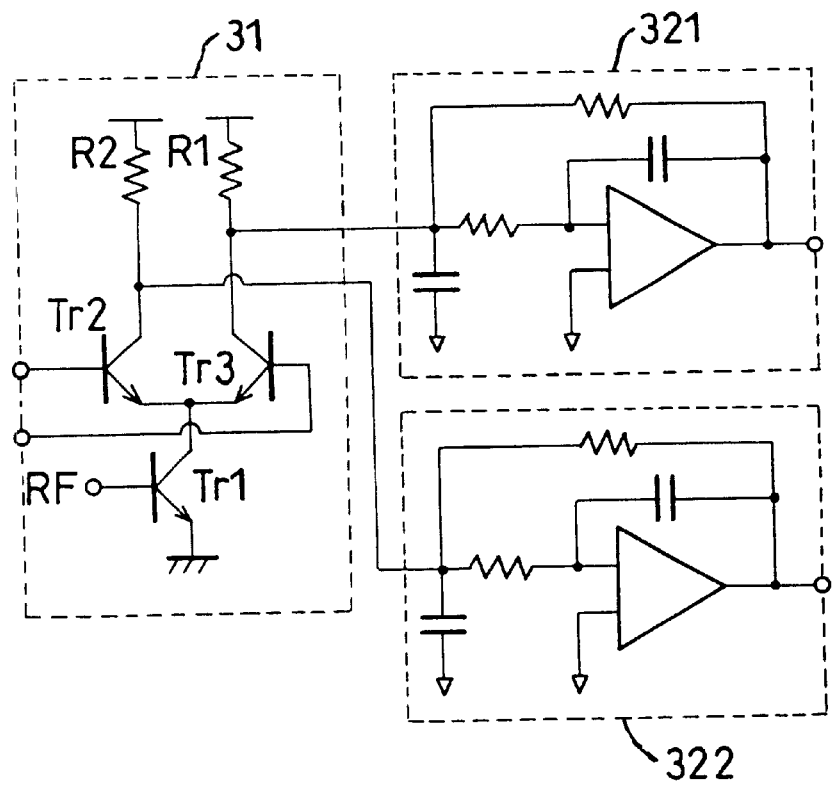
FIG. 3 is a circuit diagram of the frequency converter of the 3rd embodiment of the invention.

FIG. 3 shows circuit constitution of frequency converter in connection with the 3rd embodiment of the invention. This frequency converter is comprised of mixer circuit 31 and two buffer amplifiers 321, 322. Mixer circuit 31 has the same constitution as the mixer circuits in the 1st and 2nd embodiments. Buffer amplifier 321 and buffer amplifier 322 are connected to collectors of transistors Tr2 and Tr3 of mixer circuit 31, respectively. That is, buffer amplifier 321 and buffer amplifier 322 are connected to both of differential output terminal of mixer circuit 31. Buffer amplifiers 321 and 322 have 2nd-order low-pass characteristic, respectively. Such a buffer amplifier can remove very large adjacent-channel signal more efficiently as compared with the case where the circuit having first-order low-pass characteristic in the above-mentioned 1st and 2nd embodiment is used.

Figure 4A:
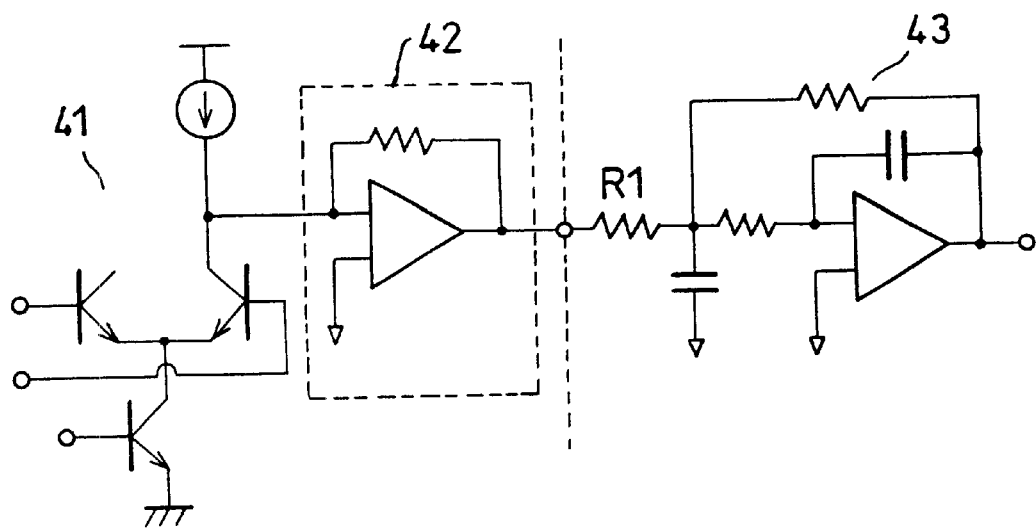
FIGS.4A, 4B, 4C, 4D and 4E are circuit diagrams for explaining the mixer circuit in the conventional constitution, and circuit modification of a filter input part.

FIG. 4A shows the circuit connected channel-select filter 43 to conventional frequency converter. This frequency converter is comprised of mixer circuit 41 of current output type, and buffer amplifier 42 of current-voltage conversion type. Input part of channel-select filter 43 has the same frequency characteristic as buffer amplifiers 321 and 322 of FIG. 3. This circuit is designed by premise that the signal source, impedance of which is sufficiently small comparing resistance R1, is connected to input part of channel-select filter 43 (namely, voltage input). Therefore, when a high impedance signal source is connected to input part, frequency characteristic will shift from design value.

Therefore, the output impedance of buffer amplifier 42 of frequency converter needs to be smaller than resistance R1 enough. Current consumption will become large if it does so.

By the way, if Thevenin's theorem and Norton's thorem are used, serial circuit of resistance R1 in input part of channel-select filter 43 in FIG. 4A and voltage signal source (buffer-amplifier 42 output) can carry out equivalent conversion under fixed conditions in parallel circuit of resistance R1 and current signal source.

Figure 4B:
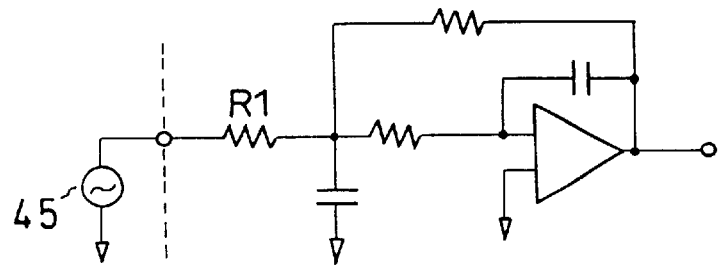
Figure 4C:
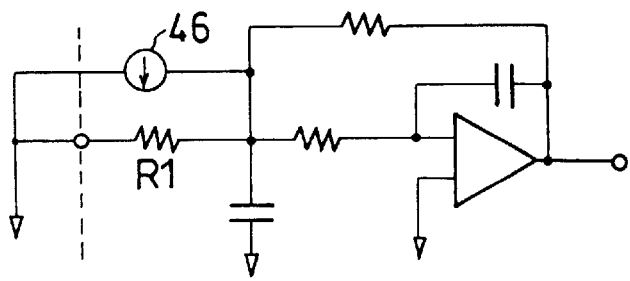

In FIG. 4A, output impedance of buffer amplifier 42 assumes that it is sufficiently smaller than resistance R1. In this case, Thevenin's theorem is applied. Then, buffer amplifier 42 seen from resistance R1 side is transposed to voltage signal source 45, and circuit of FIG. 4A turns into series circuit of resistance R1 and voltage signal source 45, as shown in FIG. 4B. Furthermore, output impedance of differential pair comprised with transistors Tr2 and Tr3 assumes that it is sufficiently larger than resistance R1. In this case, Norton's thorem is applied. Then, as shown in FIG. 4C, the above-mentioned series circuit becomes equivalent to parallel circuit of the above-mentioned resistance R1, resistance R1 of the same value, and current signal source 46.

Figure 4D:
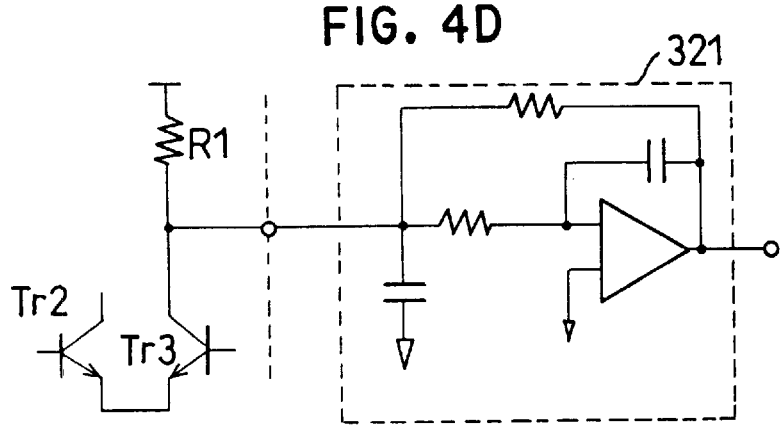
Figure 4E:
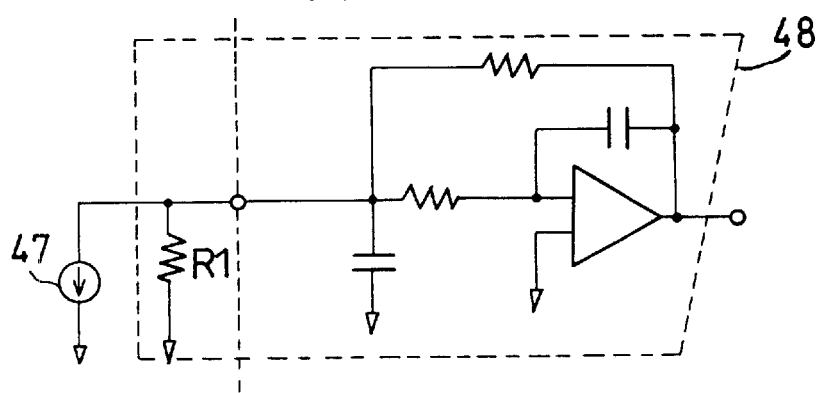

On the other hand, FIG. 4D is circuit diagram which omitted some part in circuit shown in FIG. 3. If the circuit shown in FIG. 4D is transformed into the equivalent circuit by Norton, it will become circuit of FIG. 4E. The circuit shown in FIG. 4E is the same circuit as FIG. 4C. Therefore, under certain conditions, the frequency characteristic of circuit of FIG. 3 and circuit of FIG. 4 becomes the same. In FIG. 3, mixer circuit 31 seems to output voltage, using resistance R1 as load. However, this circuit is a circuit which transformed the input part of channel-select filter 43 into current signal-source input type in FIG. 4A, in fact. By this constitution, since amplifier of low output impedance is omitted, current consumption can be made few.

Figure 5:
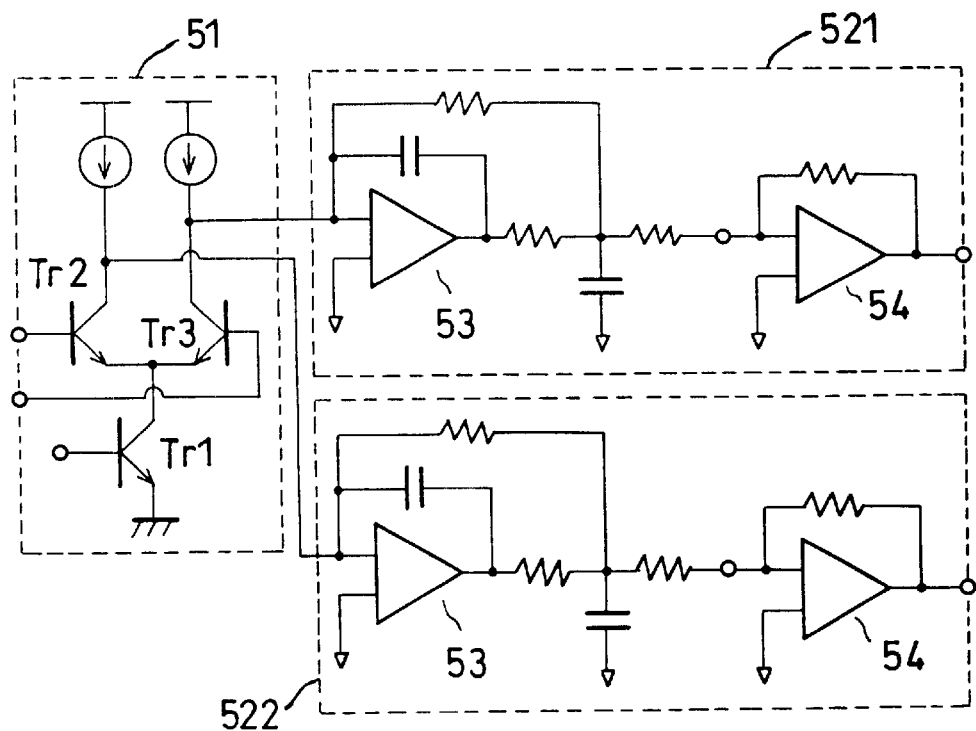
FIG. 5 is a circuit diagram of the frequency converter of the 4th embodiment of the invention.

FIG. 5 shows circuit constitution of frequency converter concerning the 4th embodiment of the invention. In the frequency converter shown in FIG. 3, since current input type buffer amplifiers 321, 322 was used, an amplifier of low output impedance became unnecessary. However, as mentioned above, in order to function as a current source, it is needed that output impedance of differential pair comprised of transistors Tr2 and Tr3 in the mixer circuit is larger than R1 enough. For example, the value of resistance R1 is 1k Ω, and supposing we want to stop influence of output impedance of transistor within about 1%, impedance more than 100k Ω is required.

However, especially output impedance of high-speed transistor tends to become low. Since a lot of bias current is passed to mixer circuit of broad linear range still like direct conversion system, output impedance becomes small further. Circuit suitable for such conditions is shown in FIG. 5. In FIG. 5, 53 is adjoint circuit of Sallen-Key circuit, 54 is current-voltage converter, and these are mentioned later. In this circuit constitution, the frequency converter is comprised by mixer circuit 51 and buffer amplifiers 521 and 522. Input terminal of buffer amplifiers 521 and 522 is an input terminal of operation amplification circuit 53. And since feedback circuit is also connected to this terminal, impedance of this part becomes very small. For this reason, conditions of output impedance of mixer circuit 51 are eased significantly.

Figure 6A:
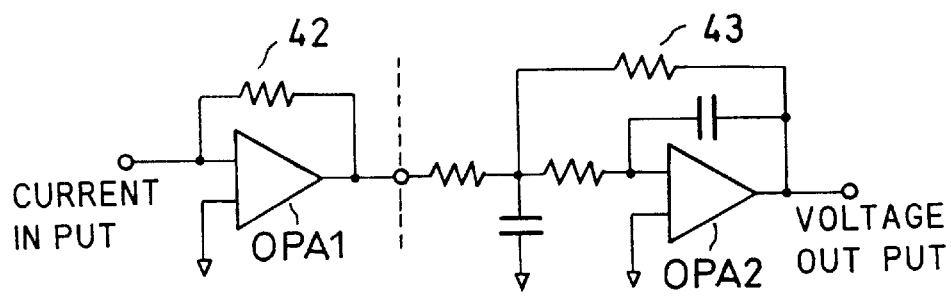
FIGS. 6A and 6B are circuit diagrams for explaining the circuit modification concerning the 4th embodiment of the invention.

FIG. 6A shows transforming conventional circuit shown in FIG. 4A into circuit of embodiment shown in FIG. 5. That is, the circuit of FIG. 6A comprises buffer amplifier 42 of conventional circuit shown in FIG. 4A, and input part of channel-select filter 43. Channel-select filter 43 comprises Sallen-Key circuit. Sallen-Key circuit is disclosed by R. P. Sallen and E. L. Key's "A Practical Method of Designing RC Active Flters" (IRE Transactions-Circuit Theory, March 1955, pp74–85).

Figure 6B:
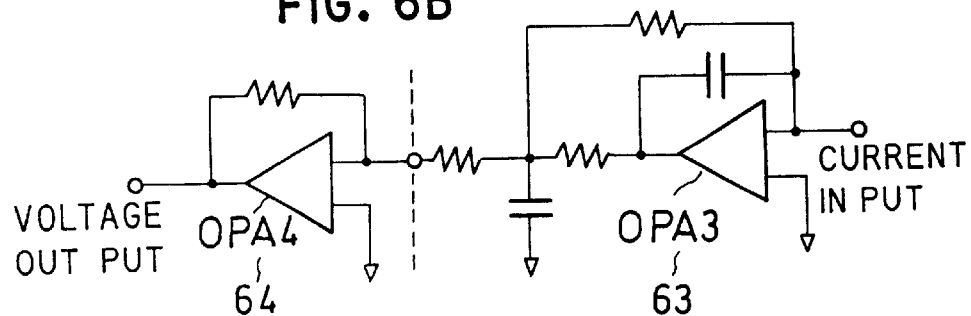

Circuit shown in FIG. 6B is comprised in circuit of FIG. 6A by reversing input and output of operational amplifiers OPA1 and OPA2, converting current input into voltage output, and converting voltage output into current input. 63 is adjoint circuit of Sallen-Key circuit 43, and 64 is current-voltage converter. Operational amplifiers OPA3 and OPA4 are operational amplifiers which correspond to operational amplifiers OPA2 and OPA1 respectively. Transfer function of circuit shown in FIG. 6A and circuit shown in FIG. 6B is equal. In addition, adjoint circuit is used in calculation of element sensitivity which shows influence of error of element value.

Circuit shown in FIG. 6B is used as buffer amplifiers 521 and 522 in FIG. 5. These buffer amplifiers 521 and 522 are advantageous also about not only making current consumption few but also relief of impedance conditions of mixer circuit 51. In circuit shown in FIG. 4A, output buffer (buffer amplifier 42) also needed to amplify linearly large adjacent-channel signal. However, in circuit shown in FIG. 5, since adjoint circuit 53 of Sallen-Key circuit which has filter function is connected to mixer circuit 51, operation amplification circuits having narrow output voltage range or narrow frequency range can be used.

By the way, in 1 embodiment of the invention shown in FIG. 5, buffer amplifier 521 was comprised of adjoint circuit 53 of Sallen-Key circuit, and current-voltage converter 54. However, under a certain condition, current-voltage converter 54 is not necessarily needed as mentioned later.

By Norton's thorem, circuit shown in FIG. 4D can be changed as shown in FIG. 4E. That is, frequency-converter side is transposed to parallel circuit of resistance R1 and current signal source 47. If you asks for the adjoint circuit of the circuit in dotted line 48 as Sallen-Key circuit, the circuit which made input and output reverse will be obtained.

This adjoint circuit can be used when using filters with input impedance of filter sufficiently larger than resistance R1, such as gm-C (transconductance-capacitor) filter, as the filter connected thereafter. Frequency converter concerning the 5th embodiment shown in FIG. 7 is comprised of mixer circuit 71 and buffer amplifiers 72 and 73.

Adjoint circuit of Sallen-Key circuit 48 shown in FIG. 4E mentioned above as buffer amplifier 72 is used. Since buffer amplifier 73 was the same constitution as buffer amplifier 72, illustration of the circuit is omitted.

Figure 7:
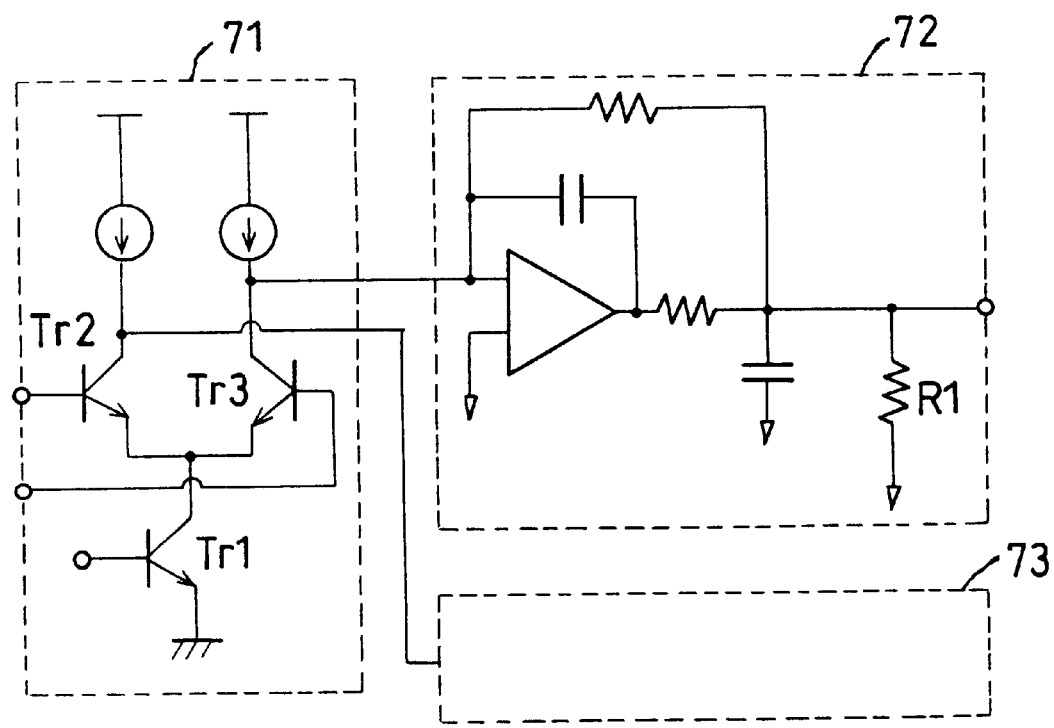
FIG. 7 is a circuit diagram of the frequency converter of the 5th embodiment of the invention.
Figure 8:
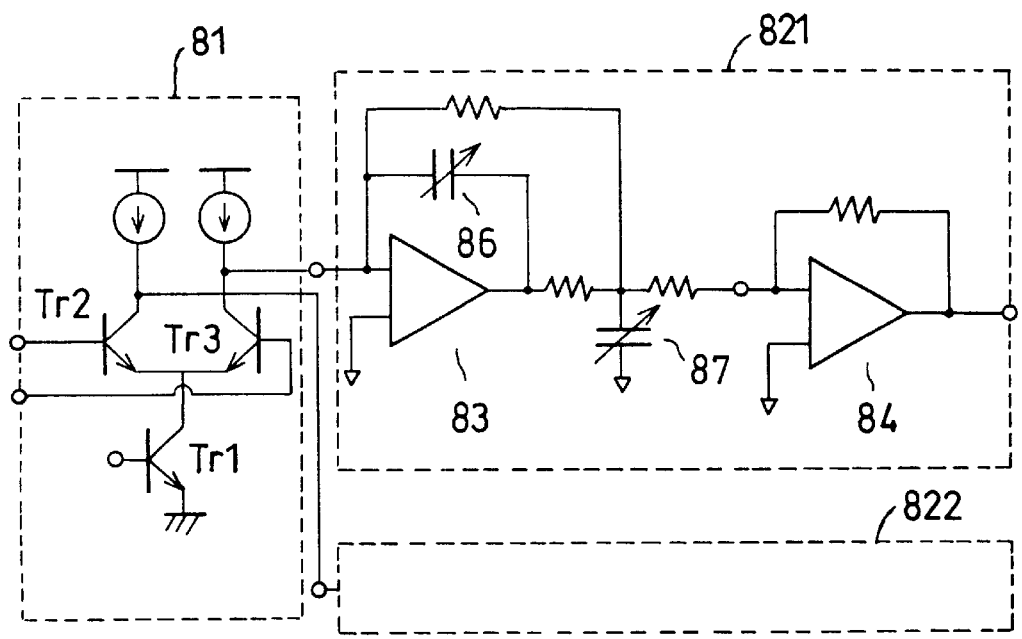
FIG. 8 is a circuit diagram of the frequency converter of the 6th embodiment of the invention.

As explained above, frequency converter without current-voltage converter shown in FIG. 7 can be used when input impedance of channel-select filter connected to output terminals of these buffer amplifiers 72 and 73 is sufficiently larger than resistance R1. Constitution of frequency converter of the 6th embodiment of the invention which made variable capacity element of inside, such as buffer amplifier 521 in embodiment shown in FIG. 5, is shown in FIG. 8.

In recent years, also in radio communication, transmission of digital signal is becoming center, and the case where not only sound but picture and document are transmitted by radio as digital data is increasing. The communication system, which takes small occupancy frequency band when transmitting audio telephone call and small data, and takes broad occupancy frequency band when transmitting picture, especially moving picture, is examined. Thus, without a user being conscious in the radio communication which can change a communication method, it is controlled by the computer program so that a required setup is performed. The flow chart of the communication setting control in such a case is shown in FIG. 15. If the sound is transmitted and a user expects transmission of an image in process 151, the signal which requests a picture signal through a control channel in process 152 will be transmitted. It checks whether an image channel can be used in process 153, and if it cannot be used, the disenable message is displayed in process 154.

When an image channel can be used, namely when image communication is possible in both side of transmission and reception, hardware setup including the frequency selection characteristic will be performed so that images can be transmitted in process 155.

Then, transmission side communicates reception side in process 156 and images is transmitted. Transmission of an image is continued as long as there is an image which should be sent in process 157. After image communication is completed, it moves to process 158 and a setup is returned to voice transmission. The frequency converter shown in FIG. 8 is a suitable circuit for the above communication system. The frequency converter shown in FIG. 8 is comprised of mixer circuit 81 and buffer amplifiers 821 and 822. Buffer amplifier 821 is comprised of adjoint circuit 83 of Sallen-Key circuit, and current-voltage converter 84. Capacity elements in adjoint circuit 83 is variable capacity elements 86 and 87.

Figure 9:
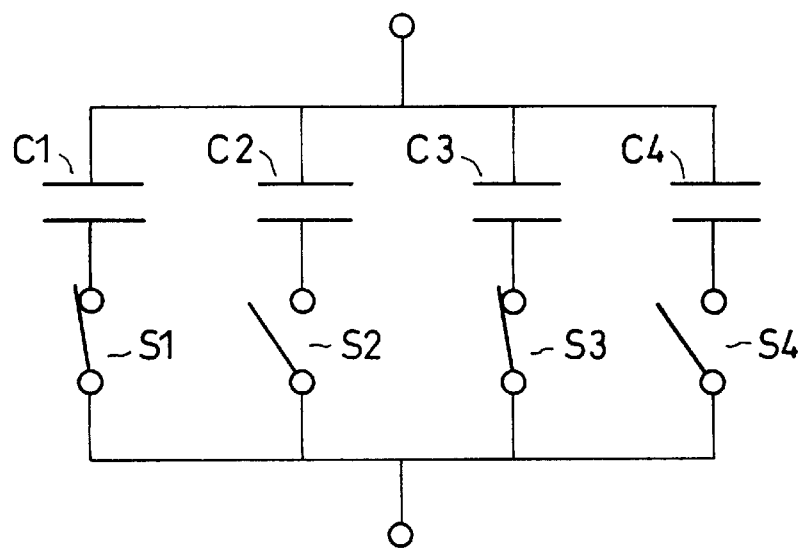
FIG. 9 is a circuit diagram of a variable capacity element used for the 6th embodiment of FIG. 8.

For example, as shown in FIG. 9, these variable capacity elements of each is comprised of parallel connection of the four series circuits, each of which is comprised of a fixed capacity element and a switch.

Each capacity value of capacity elements C1, C2, C3, and C4 presupposes that it is 8:4:2:1. Since capacity values of the 4th power of 2 are obtained by opening or closing each of switches S1, S2, S3, and S4, and suitable value can be chosen out of those values. In addition, since buffer amplifier 822 was the same constitution as buffer amplifier 821, the circuit diagram is omitted.

Case where occupancy band is extended is considered in process 155 of flow chart shown in FIG. 15. What is necessary is just to make capacity small by turning OFF, for example, switch S1 connected to fixed capacity elements of FIG. 9 in this case. Frequency converter shown in FIG. 8 is utilizable in radio communication which changes occupancy frequency band if needed.

This frequency converter also has advantage of not changing gain in passage frequency band even if it changes frequency characteristic.

Figure 10:
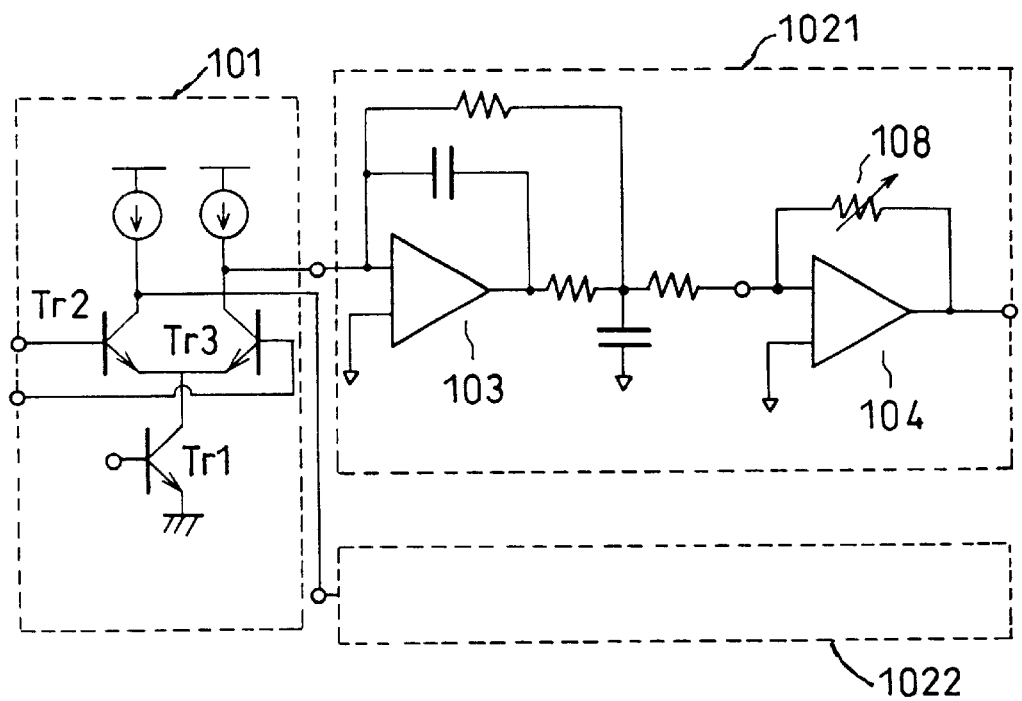
FIG. 10 is a circuit diagram of the frequency converter of the 7th embodiment of the invention.

Constitution of frequency converter concerning the 7th embodiment of the invention is shown in FIG. 10. In this embodiment, variable resistance element 108 is used as resistance of current-voltage converter 104. That is, this frequency converter is comprised of mixer circuit 101 and buffer amplifiers 1021 and 1022. Buffer amplifier 1021 is comprised of adjoint circuit 103 of Sallen-Key circuit, and current-voltage converter 104.

Figure 11:
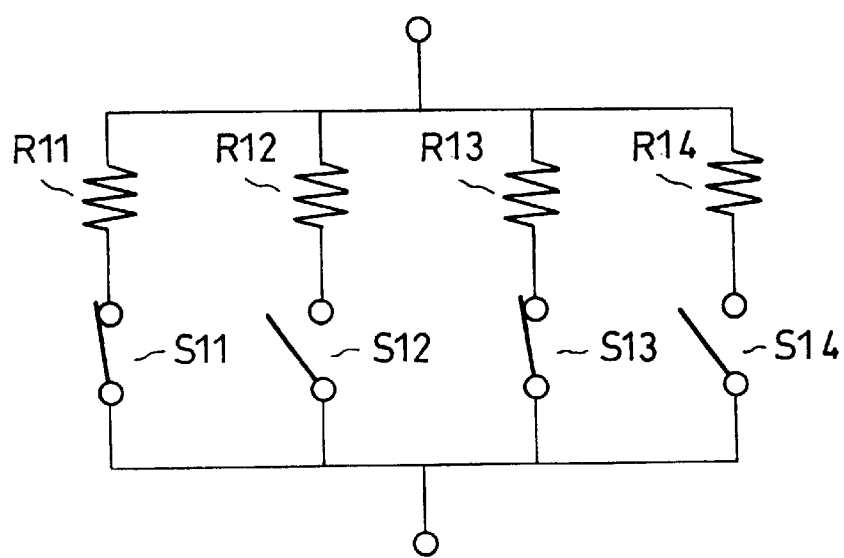
FIG. 11 is a circuit diagram of the variable resistance element 108 used for the 7th embodiment of FIG. 10.

In addition, since buffer amplifier 1022 is the same constitution as buffer amplifier 1021, circuit diagram is omitted. For example, as shown in FIG. 11, variable resistance element 108 is comprised of parallel connection of the four series circuits, each of which is comprised of a fixed resistance element and a switch. Each resistance value of resistance elements R11, R12, R13, and R14 is made into 8:4:2:1. In this case, 4-bit variable gain frequency converter is obtained by opening or closing each of switches S11, S12, S13, and S14. Frequency converter shown in FIG. 11 has advantage that the change does not affect frequency characteristic even if value of variable resistance element 108 changes.

Figure 12:
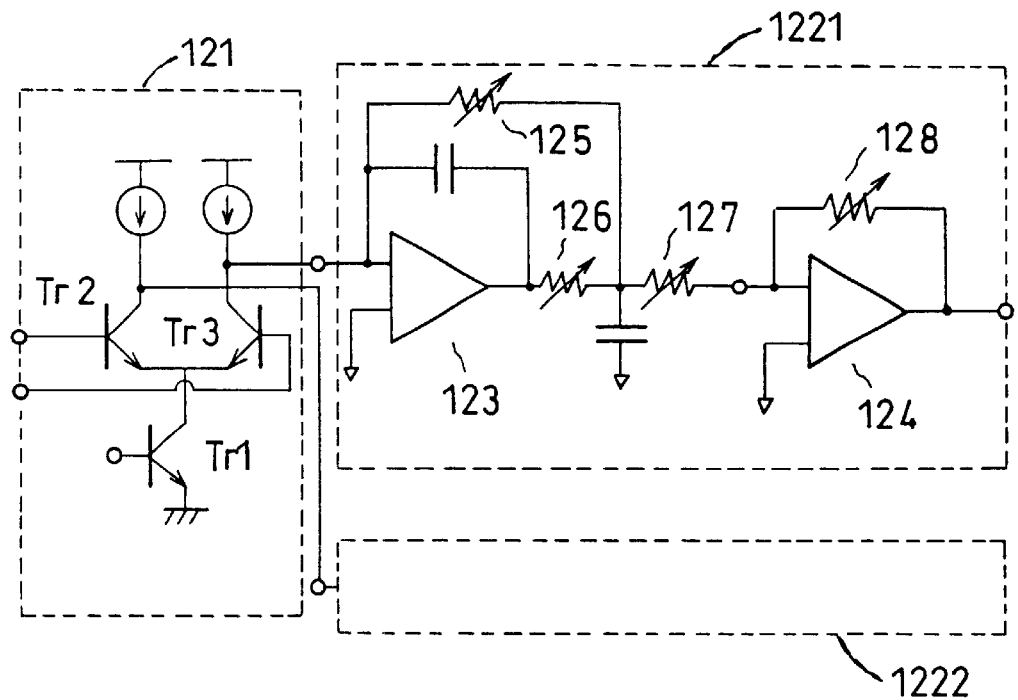
FIG. 12 is a circuit diagram of the frequency converter of the 8th embodiment of the invention.
Figure 13:
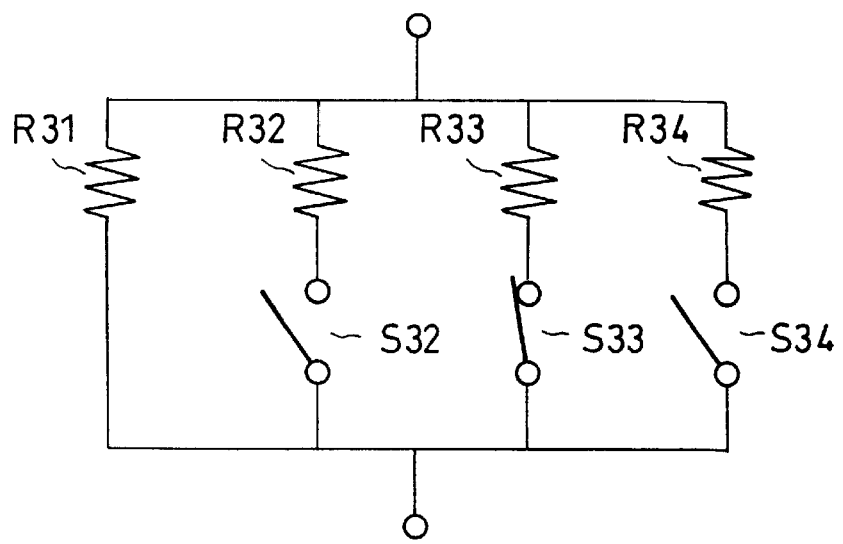
FIG. 13 is a circuit diagram of the variable resistance element used for the 8th embodiment of FIG. 12.

Moreover, if especially channel-select filter is comprised by an integrated circuit, value deviation of each element is large and a certain adjustment may be required to obtain desired frequency characteristic. In such a case, frequency converter shown in FIG. 12 is suitable. That is, variable resistance elements 125, 126, 127 and 128 are used as resistance elements of adjoint circuit 123 of Sallen-Key circuit, and current-voltage converter 124 in buffer amplifier 1221. And each of these variable resistance elements is set as constitution shown, for example, in FIG. 13. That is, this variable resistance element is comprised of resistance R31 and three series circuits, which is comprised of switches S32, S33, and S34 and resistance R32, R33, and R34, respectively. These series circuits are for rectifying deviation of the resistance value.

This frequency converter is comprised of mixer circuit 121 and buffer amplifiers 1221 and 1222. Buffer amplifier 1221 is comprised of adjoint circuit 123 of Sallen-Key circuit, and current-voltage converter 124. In addition, since buffer amplifier 1222 is the same constitution as buffer amplifier 1221, circuit diagram is omitted. In this variable frequency converter, manufacture deviation of each resistance value can be rectified by opening or closing respectively switches S32, S33, and S34. Therefore, according to this embodiment, more exact frequency characteristic is realizable.

Figure 14:
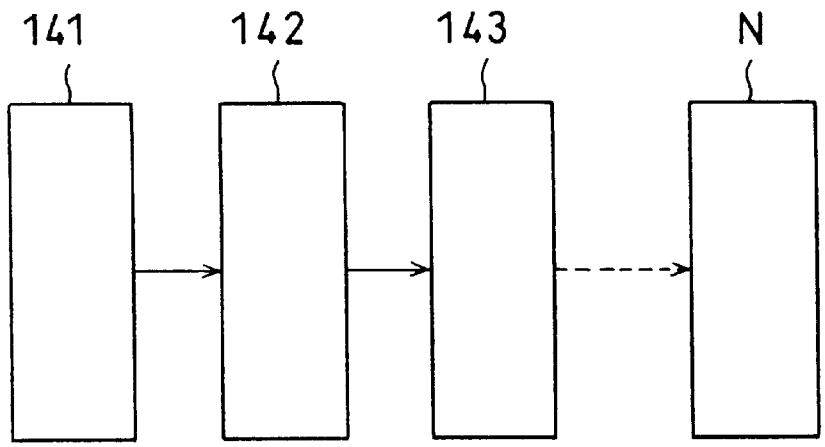
FIG. 14 is a block diagram of the frequency converter of the 9th embodiment of the invention.
Figure 16:
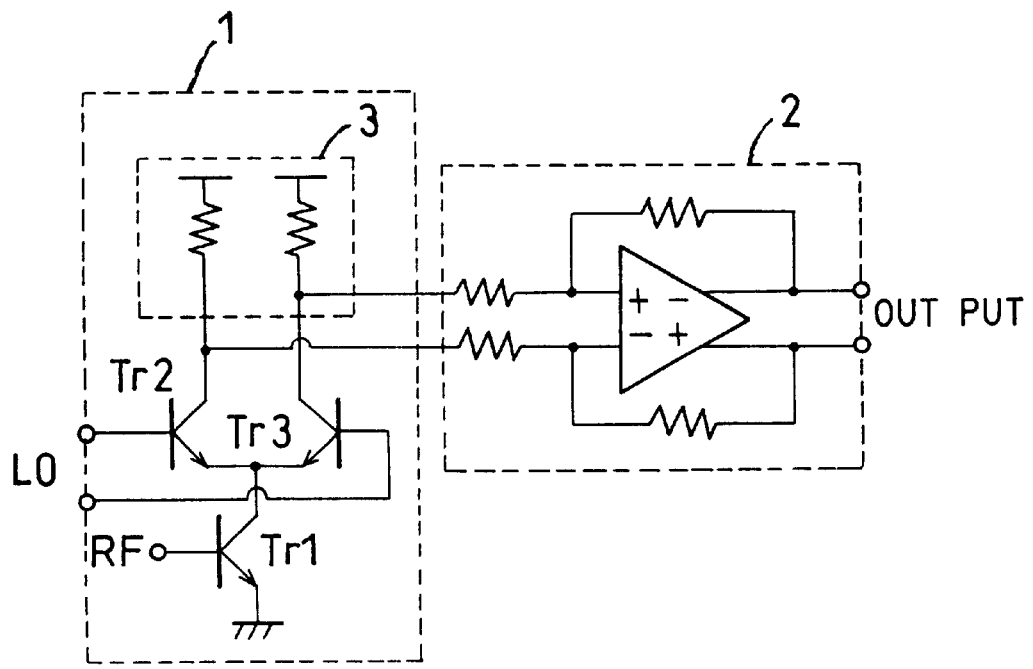
FIG. 16 is a circuit diagram of a conventional frequency converter.

By the way, in above-mentioned all embodiment, one buffer amplifier is connected to one mixer circuit and it comprise of frequency converter. however, the 9th embodiment shown in FIG. 14 mixer circuit 141 may be connected to two or more buffer amplifiers preferably three to five buffer amplifiers, such as buffer amplifiers 142, 143, etc. According to this constitution, two or more steps of buffer amplifiers amplify only desired signal one by one, without amplifying unnecessary signal. Therefore, level of unnecessary signal becomes ½, ¼, and ⅛—to desired signal, and high desired signal of SNR is obtained.

Since unnecessary adjacent-channel signal is not amplified according to frequency converter the invention as explained above, current consumption of output buffer amplifier can be made small. Moreover, in case where filter and mixer are designed independently, the characteristic of filter can be easily taken in to output buffer amplifier of frequency converter by transforming circuit of first step into current input type, or changing into adjoint circuit. Therefore, the frequency converter with small current consumption is obtained, without affecting frequency selection characteristic as a receiver.

What is claimed is:

1. A frequency converter comprising:

a mixer circuit for mixing a local oscillation signal and radio-frequency input signal modulated for communication of information, and performing frequency conversion; and an output buffer amplifier for amplifying an output signal output from said mixer circuit, said output buffer amplifier comprised of an adjoint Sallen-Key circuit, using an operational amplifier, and a current-voltage converter, said output buffer amplifier having 2nd-order low-pass characteristic of a cut-off frequency, and an input terminal of said current-voltage converter being connected to an output terminal of said adjoint Sallen-Key circuit.

2. A frequency converter as claimed in claim 1, wherein the low-pass characteristic of the cut-off frequency of said output buffer amplifier is higher than a desired signal frequency band and lower than an adjacent channel carrier frequency.

3. A frequency converter as claimed in claim 1, wherein said current-voltage converter includes a variable resistance element.

4. A frequency converter as claimed in claim 1, wherein said current-voltage converter having a variable resistance element, and said adjoint Sallen-Key circuit includes variable resistances.

5. A frequency converter as claimed in claim 1, wherein said adjoint Sallen-Key circuit includes variable capacity elements.

6. A frequency converter comprising:

a mixer circuit for mixing a local oscillation signal and radio-frequency input signal modulated for communication of information, and performing frequency conversion; and an output buffer amplifier for amplifying an output signal output from said mixer circuit, said output buffer amplifier having an adjoint Sallen-Key circuit using an operational amplifier, and said output buffer amplifier having 2nd-order low-pass characteristic of a cut-off frequency, wherein the low-pass characteristic of the cut-off frequency of said output buffer amplifier is higher than a desired signal frequency band and lower than an adjacent channel carrier frequency.

* * * * *